(12) United States Patent
Xu et al.

(10) Patent No.: US 11,715,743 B2
(45) Date of Patent: Aug. 1, 2023

(54) DISPLAY PANEL AND CRACK DETECTION METHOD, AND DISPLAY DEVICE

(71) Applicants: Wuhan Tianma Micro-Electronics Co., Ltd., Wuhan (CN); Wuhan Tianma Microelectronics Co., Ltd. Shanghai Branch, Shanghai (CN)

(72) Inventors: Zi Xu, Shanghai (CN); Lin Cheng, Shanghai (CN); Xinzhao Liu, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

(*) Notice: Subject to any disclaimer, the term of this patent is extended or adjusted under 35 U.S.C. 154(b) by 55 days.

(21) Appl. No.: 17/191,891

(22) Filed: Mar. 4, 2021

(65) Prior Publication Data
US 2022/0199651 A1    Jun. 23, 2022

(30) Foreign Application Priority Data
Dec. 22, 2020  (CN) .......................... 202011526585.2

(51) Int. Cl.
*H01L 27/12*  (2006.01)
*G01R 31/28*  (2006.01)
(Continued)

(52) U.S. Cl.
CPC ........ *H01L 27/124* (2013.01); *G01R 31/2884* (2013.01); *G02F 1/13338* (2013.01);
(Continued)

(58) Field of Classification Search
CPC .. G01M 5/0033; G01M 5/0083; G01R 1/0735
See application file for complete search history.

(56) References Cited

U.S. PATENT DOCUMENTS 4,771,230 A * 9/1988 Zeh .......................... G01R 1/072
                                                        324/459
9,709,619 B2 * 7/2017 Iriguchi ............. G01R 31/2805
(Continued)

FOREIGN PATENT DOCUMENTS

CN    106952576 A    7/2017
CN    107255655 A    10/2017
(Continued)

*Primary Examiner* — Jermele M Hollington
*Assistant Examiner* — Temilade S Rhodes-Vivour
(74) *Attorney, Agent, or Firm* — Anova Law Group, PLLC

(57) ABSTRACT

A display panel, a crack detection method and a display device are provided. The display panel includes a substrate, a signal wiring disposed over the substrate, and a test wiring insulated from the signal wiring and disposed on a side of the signal wiring facing away from the substrate. An orthographic projection of the test wiring on the substrate overlaps an orthographic projection of the signal wiring on the substrate. The display panel also includes a first test terminal disposed over the substrate and electrically connected with an end of the test wiring, and a second test terminal disposed over the substrate and electrically connected with another end of the test wiring.

16 Claims, 15 Drawing Sheets

(51) Int. Cl.
*G02F 1/1362* (2006.01)
*G02F 1/1333* (2006.01)
*H10K 59/40* (2023.01)
*H10K 59/131* (2023.01)

(52) U.S. Cl.
CPC .... *G02F 1/13629* (2021.01); *G02F 1/136254* (2021.01); *H10K 59/131* (2023.02); *H10K 59/40* (2023.02)

(56) References Cited

U.S. PATENT DOCUMENTS

| | | | |
|---|---|---|---|
| 10,431,136 B2* | 10/2019 | Zhou | G09G 3/20 |
| 2002/0191140 A1* | 12/2002 | Eguchi | G02F 1/1345 |
| | | | 349/149 |
| 2016/0071463 A1* | 3/2016 | Takahashi | G09G 3/3275 |
| | | | 327/109 |
| 2017/0271368 A1* | 9/2017 | Zhang | H01L 27/1259 |
| 2018/0158894 A1* | 6/2018 | Park | H10K 71/70 |
| 2020/0119050 A1* | 4/2020 | Li | H01L 27/1248 |

FOREIGN PATENT DOCUMENTS

| | | |
|---|---|---|
| CN | 109791316 A | 5/2019 |
| CN | 111366619 A | 7/2020 |

\* cited by examiner

DISPLAY PANEL AND CRACK DETECTION METHOD, AND DISPLAY DEVICE

CROSS-REFERENCE TO RELATED APPLICATION

This application claims the priority of Chinese patent application No. 202011526585.2, filed on Dec. 22, 2020, the entirety of which is incorporated herein by reference.

FIELD

The present disclosure generally relates to the field of display technology and, more particularly, relates to a display panel, a crack detection method of the display panel, and a display device.

BACKGROUND

With the continuous development of display technology, display panels have been more and more widely used in various fields. To achieve the touch-control function or display function of the display panel, touch-control signal lines, data signal lines, scanning signal lines, etc., are often disposed on the display panel. During the manufacturing process of the display panel, such signal lines are at a risk of being scratched, which in turn causes cracks in such signal lines. If the signal line has a crack, the touch-control function or display function of the display panel will be affected. If the crack in the signal line cannot be detected, the defective display panel will flow into the next process or eventually flow to the client. The disclosed display panel and crack detection method, and display device are directed to solve one or more problems set forth above and other problems.

SUMMARY

One aspect of the present disclosure provides a display panel. The display panel includes a substrate, a signal wiring disposed over the substrate, and a test wiring insulated from the signal wiring and disposed on a side of the signal wiring facing away from the substrate. An orthographic projection of the test wiring on the substrate overlaps an orthographic projection of the signal wiring on the substrate. The display panel also includes a first test terminal disposed over the substrate and electrically connected with an end of the test wiring, and a second test terminal disposed over the substrate and electrically connected with another end of the test wiring.

Another aspect of the present disclosure provides a crack detection method of a display panel, configured to detect the display panel. The crack detection method includes providing the display panel. The display panel includes a substrate, a signal wiring disposed over the substrate, and a test wiring insulated from the signal wiring and disposed on a side of the signal wiring facing away from the substrate. An orthographic projection of the test wiring on the substrate overlaps an orthographic projection of the signal wiring on the substrate. The display panel also includes a first test terminal disposed over the substrate and electrically connected with an end of the test wiring, and a second test terminal disposed over the substrate and electrically connected with another end of the test wiring. The crack detection method also includes detecting an electrical signal between the first test terminal and the second test terminal. Detecting the electrical signal between the first test terminal and the second test terminal includes one of: detecting a resistance value between the first test terminal and the second test terminal, detecting a capacitance value generated by the second test terminal through the first test terminal, and detecting a voltage value between the first test terminal and the second test terminal. Further, the crack detection method includes according to the detected electrical signal, determining whether the test wiring has a crack; and if the test wiring has a crack, determining that the signal wiring is at a risk of having a crack, and if the test wiring does not have a crack, determining that the signal wiring does not have a crack.

Another aspect of the present disclosure provides a display device. The display device includes a display panel. The display panel includes a substrate, a signal wiring disposed over the substrate, and a test wiring insulated from the signal wiring and disposed on a side of the signal wiring facing away from the substrate. An orthographic projection of the test wiring on the substrate overlaps an orthographic projection of the signal wiring on the substrate. The display panel also includes a first test terminal disposed over the substrate and electrically connected with an end of the test wiring, and a second test terminal disposed over the substrate and electrically connected with another end of the test wiring.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

FIG. 5 illustrates a schematic diagram of an equivalent circuit of test wirings in

FIG. 4;

FIG. 7 illustrates a schematic diagram of an equivalent circuit of test wirings in

FIG. 6;

FIG. 10 illustrates a schematic diagram of an equivalent circuit of test wirings in

FIG. 8;

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

It should be noted that the relational terms such as "first" and "second" are merely used to distinguish one entity or operation from another entity or operation, and do not necessarily require or imply any such actual relationship or sequence between these entities or operations.

It should be understood that when describing the structure of a component, when a layer or a region is referred to as being "on" or "above" another layer or another region, the layer or the region may be directly on the other layer or the other region, or other layers or regions may be contained between the layer or the region and the another layer or the another region. Further, when a component is turned over, the layer or the region may be "under" or "below" the another layer or the another region.

The present disclosure provides a display panel. The display panel may be an organic light-emitting diode (OLED) display panel, or a liquid crystal display (LCD) display panel. The display panel in various disclosed embodiments may be presented in various forms, and certain examples may be described below.

Figure 1:
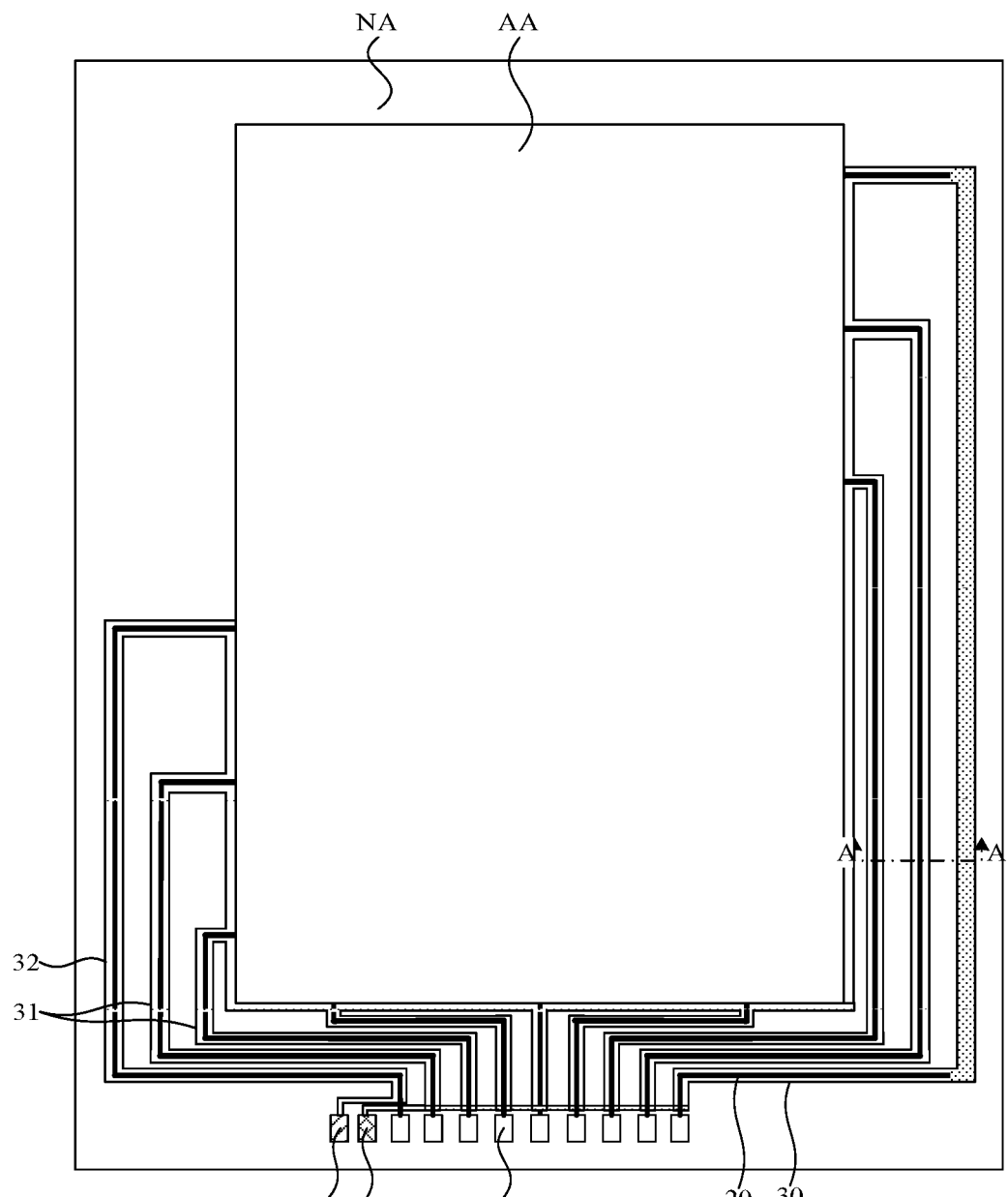
FIG. 1 illustrates a schematic top view of an exemplary display panel consistent with disclosed embodiments of the present disclosure.
Figure 2:
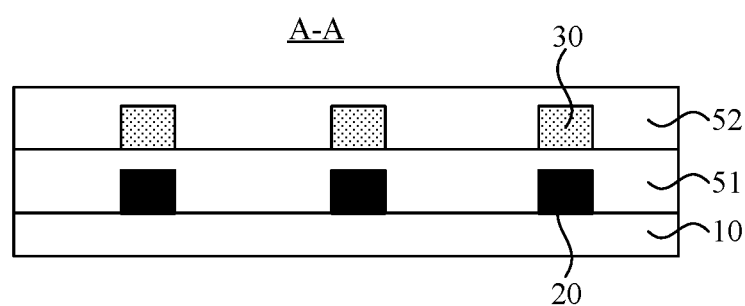
FIG. 2 illustrates a A-A sectional view of an exemplary structure in FIG. 1.

FIG. 1 illustrates a schematic top view of a display panel consistent with disclosed embodiments of the present disclosure, and FIG. 2 illustrates a A-A sectional view of the structure in FIG. 1. Referring to FIG. 1 and FIG. 2, a display panel 100 may include a substrate 10, a signal wiring 20, a test wiring 30, a first test terminal 41 and a second test terminal 42. The signal wiring 20 may be disposed over the substrate 10. The test wiring 30 may be insulated from the signal wiring 10 and may be disposed on a side of the signal wiring 20 facing away from the substrate 10. An orthographic projection of the test wiring 30 on the substrate 10 may overlap an orthographic projection of the signal wiring 20 on the substrate 10.

In the present disclosure, the test wiring 30 and the test terminal (the first test terminal 41 and the second test terminal 42) may be disposed on the display panel 100. The test wiring 30 may be disposed on the side of the signal wiring 20 facing away from the substrate 10, and the orthographic projection of the test wiring 30 on the substrate 10 may overlap the orthographic projection of the signal wiring 20 on the substrate 10. On the one hand, an electrical signal (such as a resistance value, a capacitance value, or a voltage value) between the first test terminal 41 and the second test terminal 42 may be tested to determine whether the test wiring 30 has a crack. If the test wiring 30 has a crack, the test wiring 30 may have been scratched, and a scratch depth may reach a position where the signal wiring 20 is located. Then, it may be determined that the signal wiring 20 may be at a substantially high risk of having a crack, such that the display panel with the signal wiring 20 being at a risk of having a crack may be prevented from flowing into the next process or flowing to the client. On the other hand, because the test wiring 30 is disposed on the side of the signal wiring 20 facing away from the substrate 10, the test wiring 30 and an insulating layer between the test wiring 30 and the signal wiring 20 may serve as a protection structure for the signal wiring 20, to reduce the risk of the signal wiring 20 being scratched.

In one embodiment, the electrical signal between the first test terminal 41 and the second test terminal 42 may be tested through a pin test method, which may not be limited by the present disclosure.

In one embodiment, referring to FIG. 1, the display panel 100 may include a display region AA and a non-display region NA surrounding the display region AA. The signal wiring 20 may be disposed in the non-display region NA of the display panel 100, and correspondingly, the test wiring 30 may also be disposed in the non-display region NA of the display panel 100. For example, the signal wiring 20 may be a touch-control wiring, a fan-out wiring, etc. The signal wiring 20 may also be disposed in the display region AA of the display panel 100, and correspondingly, the test wiring 30 may also be disposed in the display region AA of the display panel 100. For example, the signal wiring 20 may be a scan line, a data line, etc. The region of the display panel where the signal wiring 20 is disposed and the specific transmitted signal of the signal wiring 20 may not be limited by the present disclosure. For illustrative purposes, the signal wiring 20 may be disposed in the non-display region NA as an example.

The orthographic projection of the test wiring 30 on a plane where the substrate 10 is located may partially overlap or fully overlap the orthographic projection of the signal wiring 20 on the plane where the substrate 10 is located. It should be understood that the larger the overlapped area between the orthographic projection of the test wiring 30 on the substrate 10 and the orthographic projection of the signal wiring 20 on the substrate 10, the more accurate determining the risk of the signal wiring 20 being scratched. In certain embodiments, a trend of the test wiring 30 may be the same as a trend of the signal wiring 20. For example, the orthographic projection of the test wiring 30 on the substrate 10 may be set to cover the orthographic projection of the signal wiring 20 on the substrate 10 as much as possible. In other words, the orthographic projection of the signal wiring 20 on the substrate 10 may be set to be fully within the orthographic projection of the test wiring 30 on the substrate 10.

Referring to FIG. 2, the display panel 30 may further include a first insulating layer 51. The first insulating layer 51 may be disposed between the signal wiring 20 and the test wiring 30, such that the signal wiring 20 may be insulated from the test wiring 30. In addition, the display panel 100 may further include a second insulating layer 52. The second insulating layer 52 may be disposed on a side of the test wiring 30 facing away from the substrate 10, and may cover the test wiring 30 to prevent the test wiring 30 from being directly exposed. In one embodiment, both the first insulating layer 51 and the second insulating layer 52 may be made of an inorganic material, e.g., silicon nitride, silicon oxide, etc.

In one embodiment, the test wiring 30 may be made of a metal material. The test wiring 30 may be made of a transparent conductive material, e.g., indium tin oxide (ITO), indium zinc oxide (IZO), etc. The specific material of the test wiring 30 may not be limited by the present disclosure.

Figure 3:
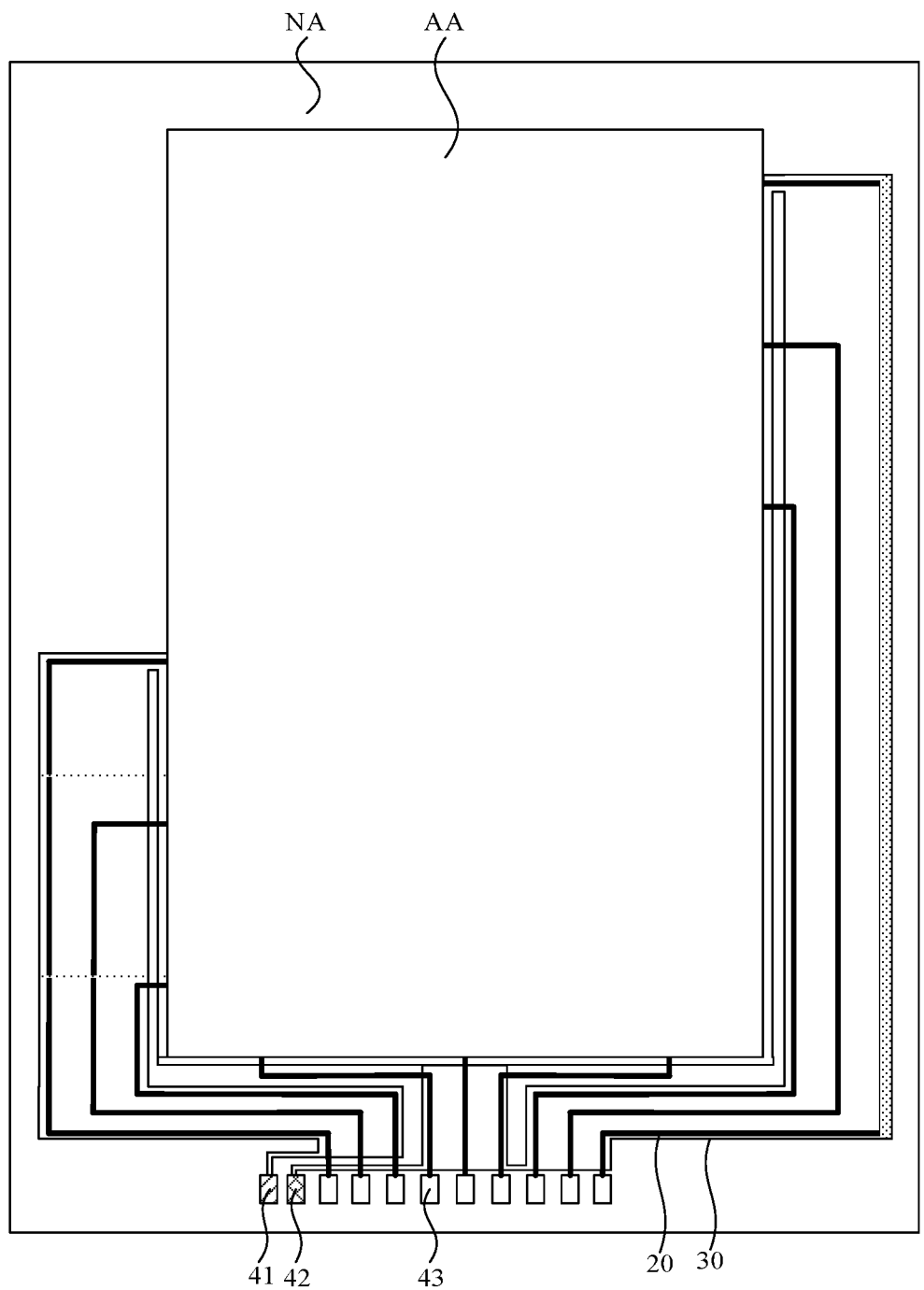
FIG. 3 illustrates a schematic top view of another exemplary display panel consistent with disclosed embodiments of the present disclosure.

In certain embodiments, a quantity of test wirings 30 may be N, where N may be an integer and N≥1. Each test wiring 30 may be disposed corresponding to at least one signal wiring 20. For example, as shown in FIG. 1, each test wiring 30 and each signal wiring 20 may be arranged in a one-to-one correspondence. In view of this, whether each signal wiring 20 is at a risk of having a crack may be determined according to the crack condition of each test wiring 30. For another example, as shown in FIG. 3, one test wiring 30 may be arranged corresponding to three signal wirings 20. In certain embodiments, one test wiring 30 may be arranged corresponding to two, four, five, etc., signal wirings 20. One test wiring 30 may be arranged corresponding to multiple signal wirings 20, which may reduce a quantity of test wirings 30. It should be understood that one test wiring 30 may be arranged corresponding to one or more signal wirings 20, which may not be limited by the present disclosure.

Figure 4:
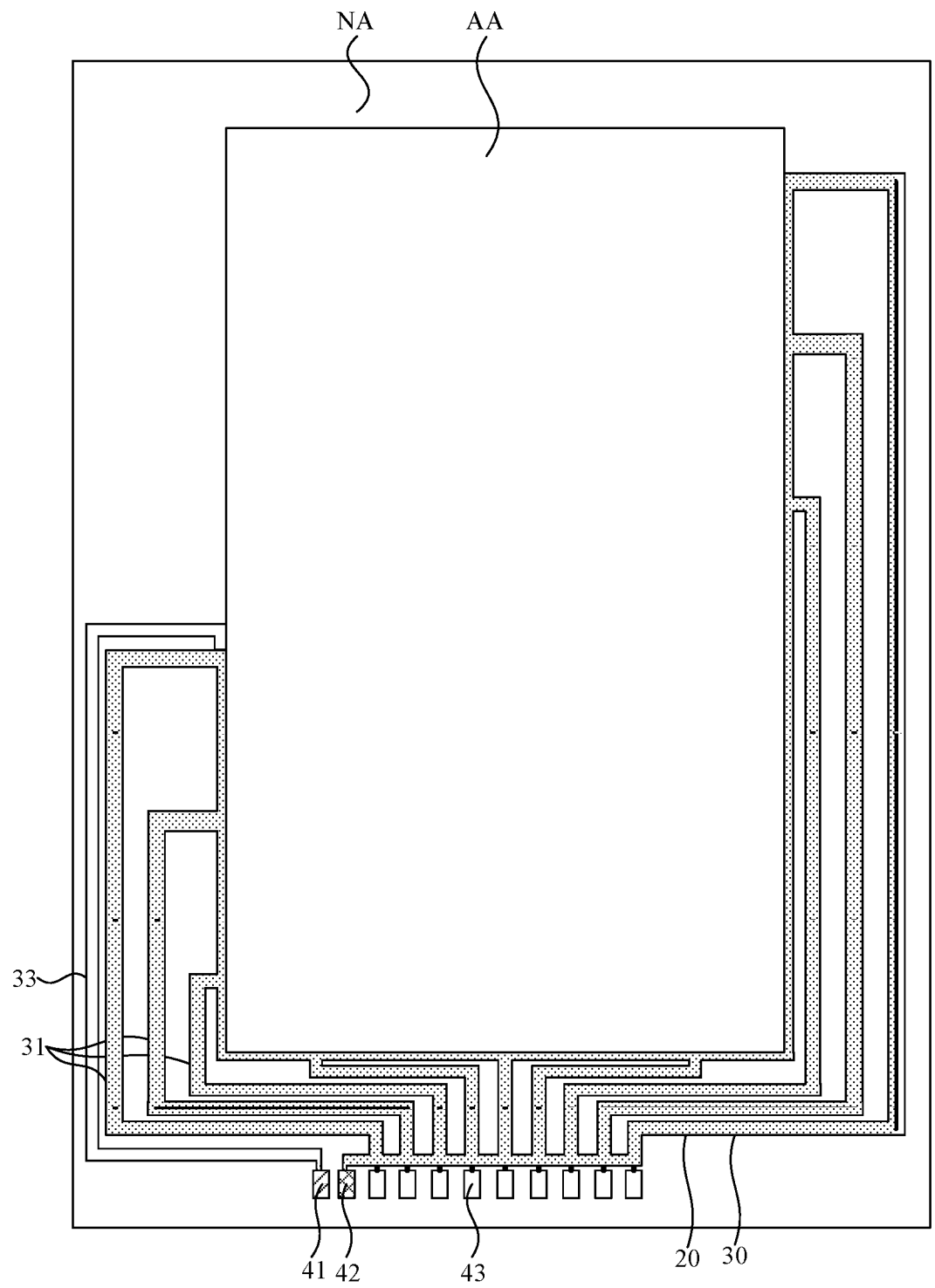
FIG. 4 illustrates a schematic top view of another exemplary display panel consistent with disclosed embodiments of the present disclosure.

In certain embodiments, referring to FIG. 1 and FIG. 4, N test wirings 30 may include M first test wirings 31, where M may be an integer and 2≤M≤N. The M first test wirings 31 may be connected in parallel between the first test terminal 41 and the second test terminal 42.

For illustrative purposes, FIG. 4 illustrates that the test wiring 30 and the signal wiring 20 may be arranged in a one-to-one correspondence, and M=N. In other words, N test wirings 30 may be connected in parallel between the first test terminals 41 and the second test terminals 42. In addition, to make each first test wiring 31 be connected in parallel between the first test terminal 41 and the second test terminal 42, a connection lead 33 may be provided, and the connection lead 33 may be formed in a same layer as the test wiring 30.

Figure 5:
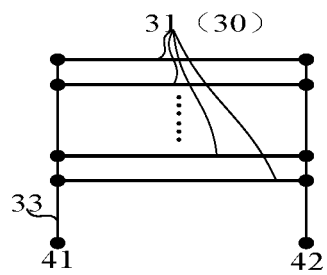

FIG. 5 illustrates a schematic diagram of an equivalent circuit of the test wirings in FIG. 4. Referring to FIG. 5, a resistance value between the first test terminal 41 and the second test terminal 42 may be tested to determine whether the test wiring 30 has a crack. In a case where each test wiring does not have a crack, the resistance value between the first test terminal 41 and the second test terminal 42 may be a total resistance value of each test wiring 30 connected in parallel. If one or more test wirings 30 have a crack, the resistance value between the first test terminal 41 and the second test terminal 42 may increase. If the tested resistance value between the first test terminal 41 and the second test terminal 42 increases, it may be determined that one or more test wirings 30 have a crack, and it may be further determined that the signal wiring 20 may be at a risk of having a crack.

In certain embodiments, referring to FIG. 1, the N test wirings 30 may include at least one second test wiring 32, and multiple first test wirings 31 connected in parallel may be electrically connected to the first test terminal 41 or the second test terminal 42 through one second test wiring 32. For illustrative purposes, FIG. 1 illustrates that a quantity of the second test wirings 32 may be one, M=N−1, and the M first test wirings 31 may be electrically connected to the first test terminal 41 through the one second test wiring 32. In view of this, the multiple first test wirings 31 may be connected in parallel without disposing an additional connection lead, which may simplify the wiring structure.

Figure 6:
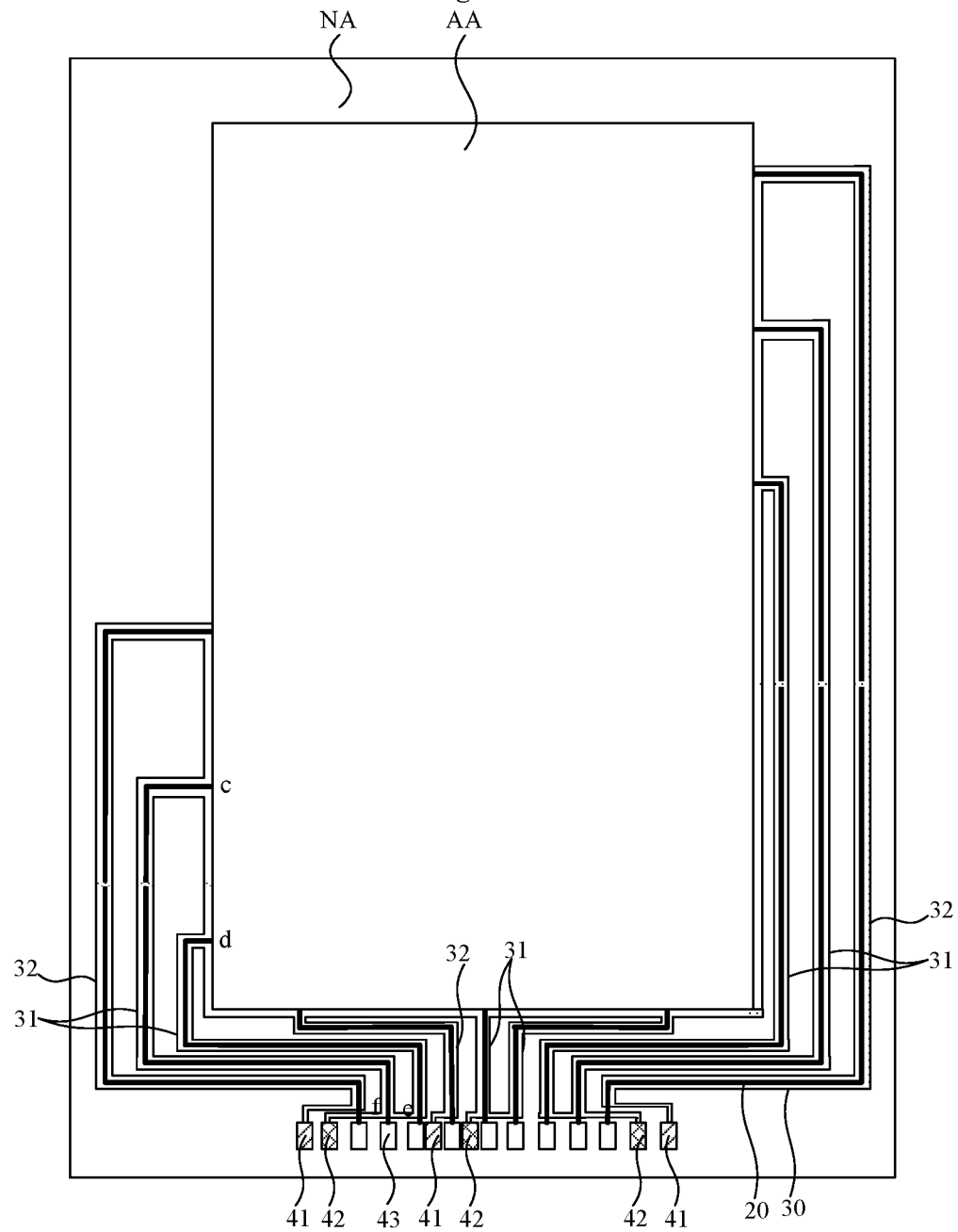
FIG. 6 illustrates a schematic top view of another exemplary display panel consistent with disclosed embodiments of the present disclosure.

In the foregoing embodiment, for illustrative purposes, both a quantity of the first test terminals 41 and a quantity of the second test terminals 42 may be one as an example. In certain embodiments, the quantity of the first test terminals 41 and the quantity of second test terminals 42 may be more than one. For example, referring to FIG. 6, the test wirings 30 may be divided into a plurality of test wiring groups, and each test wiring group may include at least two test wirings 30. One test wiring group may correspond to one first test terminal 41 and one second test terminal 42. It should be understood that the quantity of the first test terminals 41 may be equal to the quantity of the second test terminals 42. For illustrative purposes, FIG. 6 illustrates that the test wirings may be divided into three test wiring groups, and each test wiring group may include two first test wirings 31 and one second test wiring 32. The two first test wirings 31 in each test wiring group may be connected in parallel, and may be electrically connected to the first test terminal 41 through the one second test wiring 32.

Figure 7:
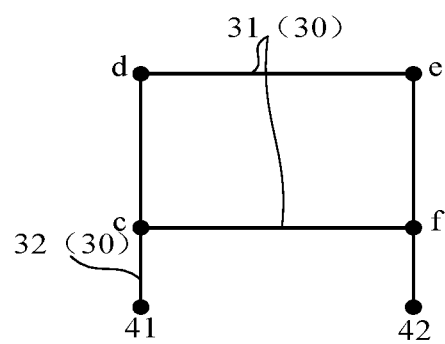

FIG. 7 illustrates a schematic diagram of an equivalent circuit of a test wiring group in FIG. 6. To clearly illustrate the relationship between the test wirings, FIG. 7 illustrates end points c, d, e, and f of each first test wiring 31 in a test wiring group. The connection relationship of each group of test wirings 30 may be the same, and the equivalent circuit of each group of the test wirings may be the same, which may not be limited by the present disclosure.

Referring to FIG. 7, the resistance value between the first test terminal 41 and the second test terminal 42 corresponding to each test wiring group may be tested to determine whether the test wirings 30 of each group have a crack. When each test wiring of each group does not have a crack, the resistance value between the first test terminal 41 and the second test terminal 42 may be the total resistance of each test wiring 30 connected in parallel. If one or more test wirings 30 have a crack, the resistance value between the first test terminal 41 and the second test terminal 42 may increase. If the tested resistance value between the first test terminal 41 and the second test terminal 42 increases, it may be determined that the test wiring 30 may have a crack, and then it may be determined that the signal wiring 20 may be at a risk of having a crack. According to the disclosed embodiments of the present disclosure, the test wiring group having a crack may be determined, and then it may be determined that the signal wiring 20 corresponding to the test wiring group may be at a risk of having a crack, such that the location of the signal wiring being at a risk of having a crack may be determined.

Figure 8:
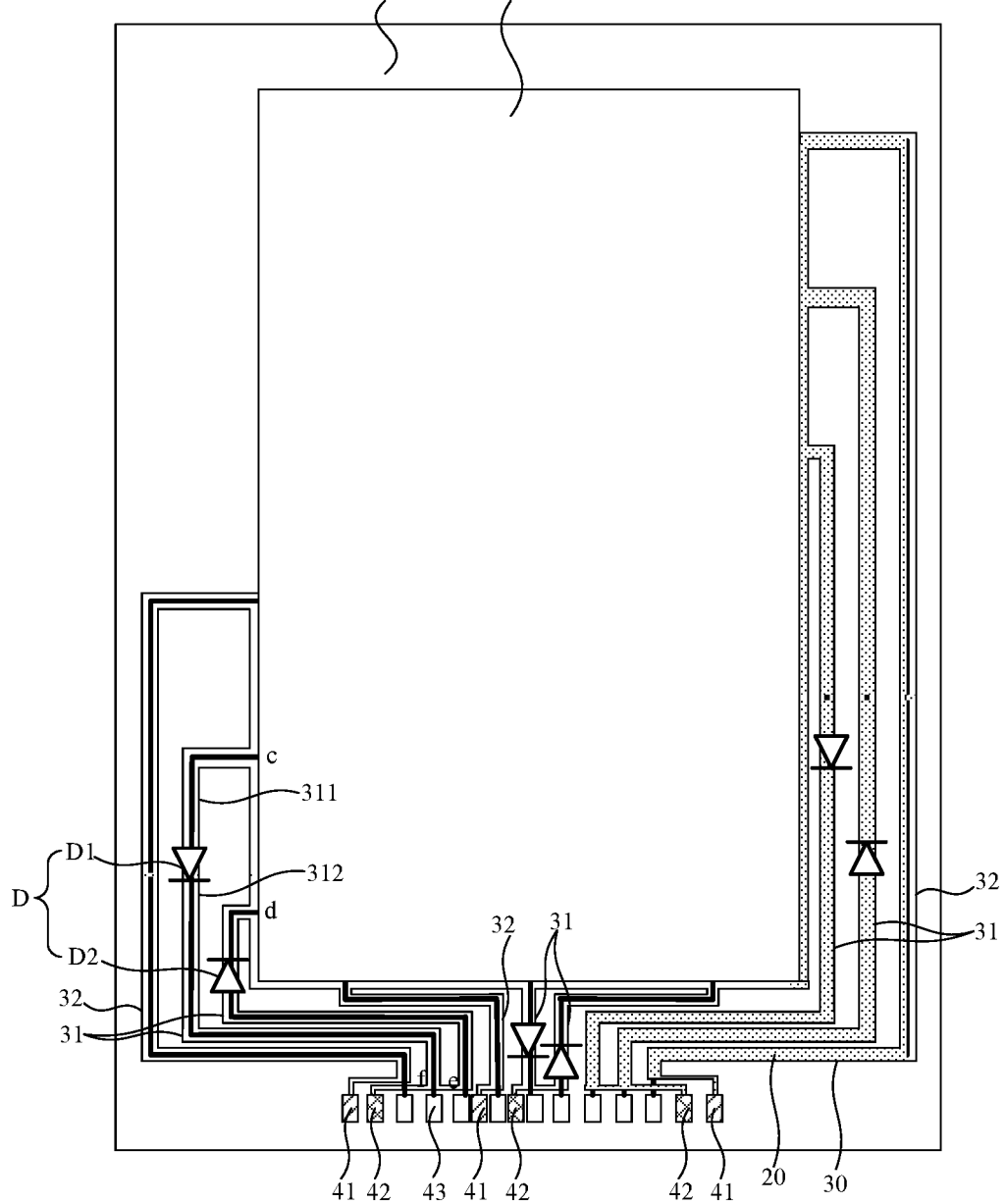
FIG. 8 illustrates a schematic top view of another exemplary display panel consistent with disclosed embodiments of the present disclosure.
Figure 9:
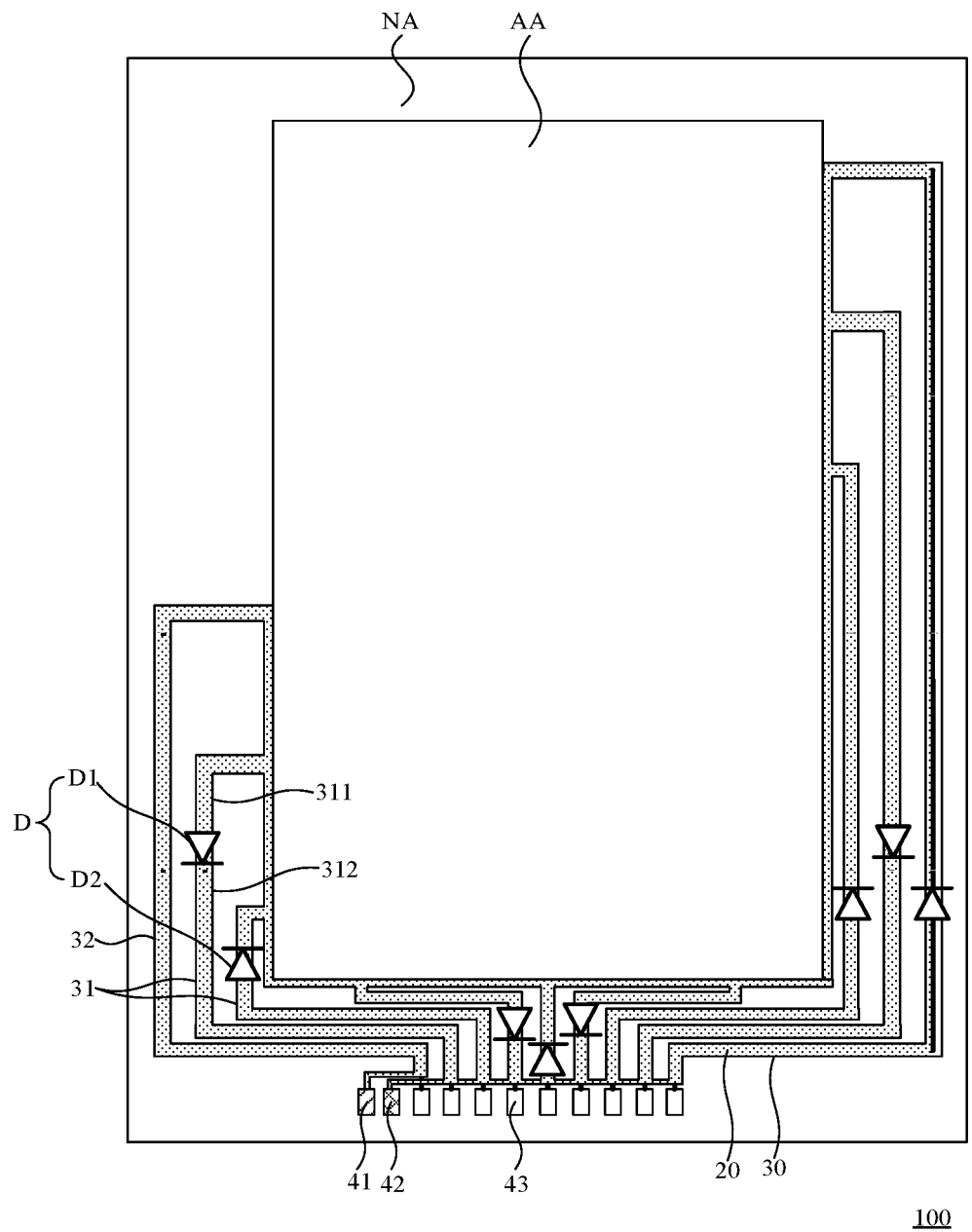
FIG. 9 illustrates a schematic top view of another exemplary display panel consistent with disclosed embodiments of the present disclosure.

In certain embodiments, referring to FIG. 8 and FIG. 9, the display panel 100 may further include a plurality of diodes D. Both a quantity of diodes D and the quantity of first test wirings 31 may be M. The diode D and the first test wiring 31 may be arranged in a one-to-one correspondence. Each first test wiring 31 may include a first section 311 and a second section 312. One of the first section 311 and the second section 312 may be connected to an anode of the diode D, and the other one may be connected to a cathode of the diode D. The M diodes may include at least one first diode D1 and at least one second diode D2. An anode of the first diode D1 may be connected to the first test terminal 41, and a cathode of the first diode D1 may be connected to the second test terminal 42. An anode of the second diode D2 may be connected to the second test terminal 42, and a cathode of the second diode D2 may be connected to the first test terminal 41. In other words, the signal directions on the two first test wirings 31 connecting the first diode D1 and the at least one second diode D2 may be opposite.

Figure 10:
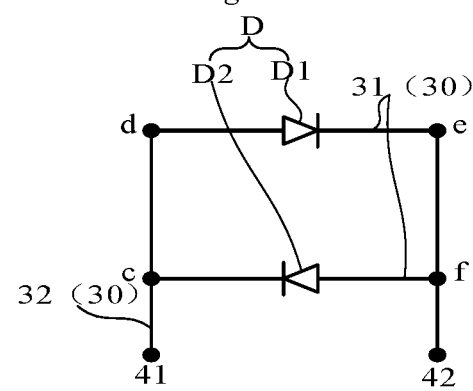

FIG. 10 illustrates a schematic diagram of an equivalent circuit of a test wiring group in FIG. 8. A positive voltage signal may be applied to the first test terminal 41, and whether the second test terminal 42 is capable of receiving a voltage signal may be tested. If the second test terminal 42 receives the voltage signal, it may be determined that the first test wiring 31 connected to the first diode D1 may not have a crack, and it may be further determined that the signal wiring 20 corresponding to the first test wiring 31 may not be at a risk of being scratched. In other words, the signal wiring 20 corresponding to the first test wiring 31 may not have a crack. If the second test terminal 42 does not receive the voltage signal, it may be determined that the first test wiring 31 connected to the first diode D1 may have a crack, and it may be further determined that the signal wiring 20 corresponding to the first test wiring 31 may be at a risk of being scratched. In other words, the signal wiring 20 corresponding to the first test wiring 31 may be at a risk of having a crack.

In addition, a positive voltage signal may be applied to the second test terminal 42, and whether the first test terminal 41 is capable of receiving a voltage signal may be tested.

If the first test terminal 41 receives the voltage signal, it may be determined that the first test wiring 31 connected to the second diode D2 may not have a crack, and it may be further determined that the signal wiring 20 corresponding to the first test wiring 31 may not be at a risk of being scratched. In other words, the signal wiring 20 corresponding to the first test wiring 31 may not have a crack. If the first test terminal 41 does not receive the voltage signal, it may be determined that the first test wiring 31 connected to the second diode D2 may have a crack, and it may be further determined that the signal wiring 20 corresponding to the first test wiring 31 may be at a risk of being scratched. In other words, the signal wiring 20 corresponding to the first test wiring 31 may be at a risk of having a crack.

In the present disclosure, by setting the diode, the location of the signal wiring being at the risk of having a crack may be specifically determined.

Figure 11:
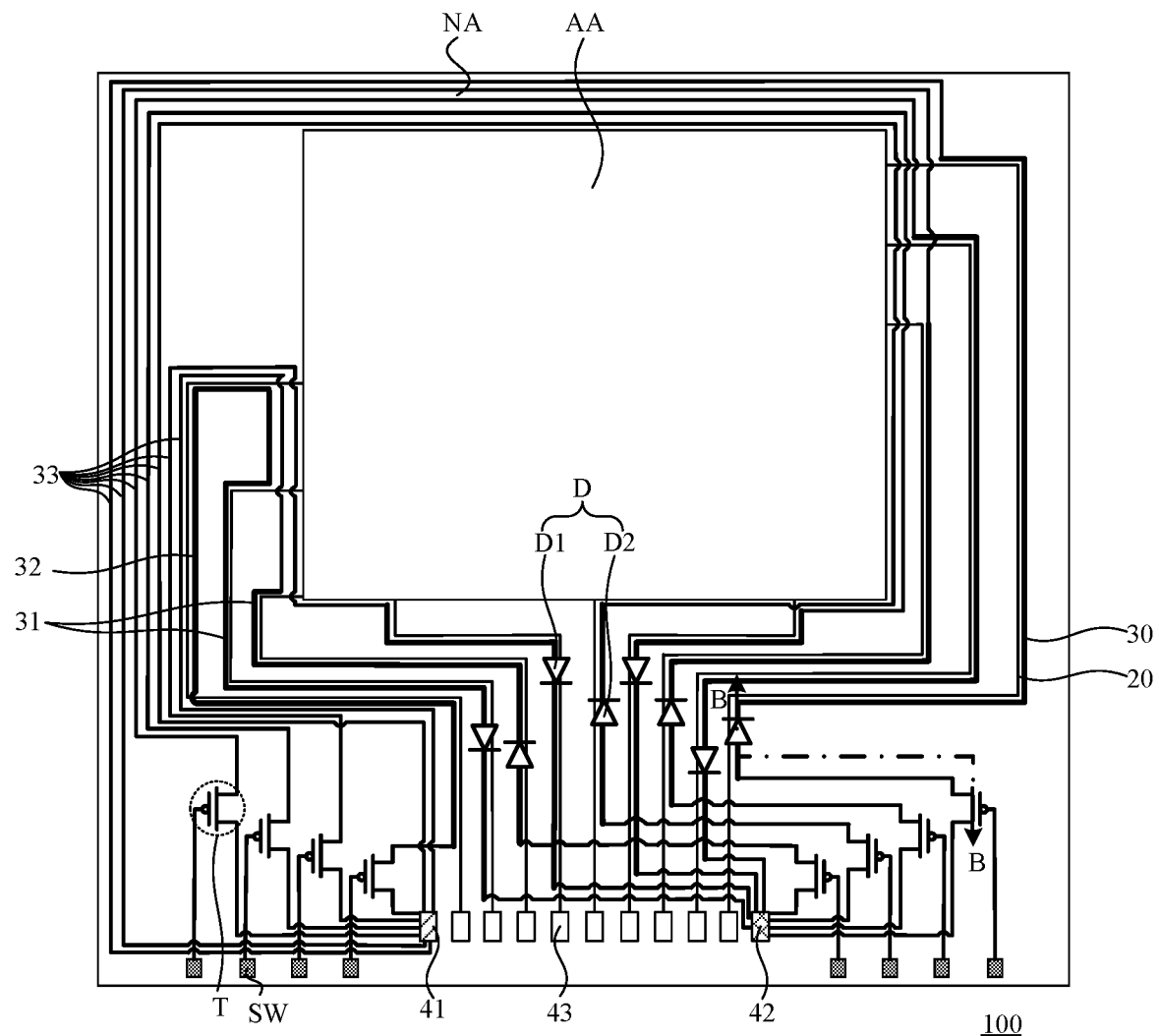
FIG. 11 illustrates a schematic top view of another exemplary display panel consistent with disclosed embodiments of the present disclosure.

In certain embodiments, referring to FIG. 11, when M≥3, in other words, when the quantity of the first test wirings 31 connected in parallel between a same first test terminal 41 and a same second test terminal 42 is greater than or equal to three, the display panel 100 may further include a transistor T and a control signal terminal SW. A gate of the transistor T may be electrically connected to the control signal terminal SW. The control signal terminal SW may be configured to output a control signal to control the "on" or "off" state of the transistor T. Among the at least one first diode and the at least one second diode, whoever of the first diode or the second diode has a quantity greater than or equal to two is may be a target diode, and each target diode and at least one transistor T may be connected in series between the first test terminal 41 and the second test terminal 42. For illustrative purposes, FIG. 11 illustrates that both the quantity of the first diodes D1 and the quantity of the second diodes D2 may be greater than two, and both the first diode D1 and the second diode D2 may be the target diode. Each target diode and one transistor T may be connected in series between the first test terminal 41 and the second test terminal 42, and the one transistor T may be connected to the anode of the target diode or the cathode of the target diode.

For illustrative purposes, FIG. 11 illustrates that the transistor T may one-to-one correspond to the diode D, and each transistor T may be electrically connected to the anode of the first diode D1 or the anode of the second diode D2. The transistor T may be connected to the anode of the diode through the connection lead 33. Each target diode and two transistors T may be connected in series between the first test terminal 41 and the second test terminal 42, where one transistor T may be connected to the anode of the target diode, and the another one transistor T may be connected to the cathode of the target diode.

It should be noted that to clearly illustrate the wirings, FIG. 11 illustrates that the orthographic projection of the signal wiring 20 on the substrate 10 may not overlap the orthographic projection of the test wiring 30 on the substrate 10. In fact, the orthographic projection of the signal wiring 20 on the substrate 10 may overlap the orthographic projection of the test wiring 30 on the substrate 10.

In addition, FIG. 11 merely illustrates that one transistor T may be connected between the first test terminal 41 and the first diode D1, and one transistor T may be connected between the second diode D2 and the second test terminal 42, which may not be limited by the present disclosure.

Figure 12:
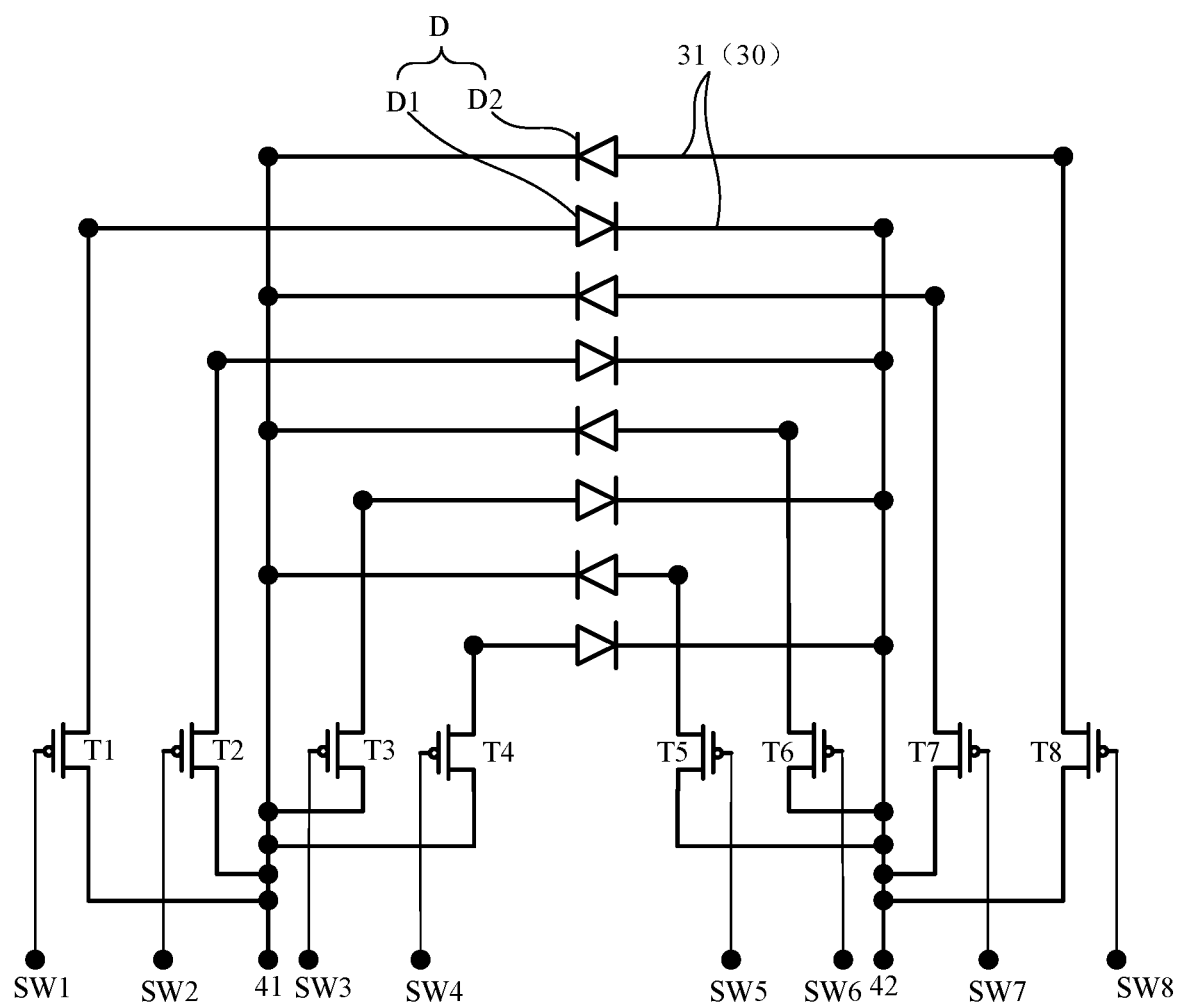
FIG. 12 illustrates a schematic diagram of an equivalent circuit of test wirings in FIG. 11.

FIG. 12 illustrates a schematic diagram of an equivalent circuit of the test wirings in FIG. 11. As shown in FIG. 12, eight control signal terminals SW may include control signal terminals SW1, SW2, SW3, SW4, SW5, SW6, SW7, SW8, respectively, and eight transistors T may include transistors T1, T2, T3, T4, T5, T6, T7, T8, respectively. A positive voltage signal may be applied to the first test terminal 41, and the control signal terminals SW may be controlled to output control signals to turn on the transistors T connected in series between the first test terminal 41 and the first diode D1 in a time-sharing manner, to test whether the second test terminal 42 receives a voltage signal. For example, a positive voltage signal may be applied to the first test terminal 41, and the transistors T respectively connected to the control signal terminals SW1, SW2, SW3, SW4 may be turned on in sequence, to test whether the second test terminal 42 receives a voltage signal.

If when each transistor T is turned on, the second test terminal 42 receives the voltage signal, it may be determined that each first test wiring 31 connected to the first diode D1 may not have a crack, and then it may be further determined that the signal wiring 20 corresponding to each first test wiring 31 connected to the first diode D1 may not be at a risk of being scratched. In other words, the signal wiring 20 corresponding to each first test wiring 31 connected to the first diode D1 may not have a crack. If when one or more transistors T are turned on, the second test terminal 42 does not receive a voltage signal, it may be determined that the first test wiring 31 connected to the transistor may have a crack, and then it may be further determined that the signal wiring 20 corresponding to the first test wiring 31 may be at a risk of being scratched. In other words, the signal wiring 20 corresponding to the first test wiring 31 may be at a risk of having a crack.

In addition, a positive voltage signal may be applied to the second test terminal 42, and the control signal terminals SW may be controlled to output control signals to turn on the transistors T connected in series between the second test terminal 42 and the second diode D2 in a time-sharing manner, to test whether the first test terminal 41 receives a voltage signal. For example, a positive voltage signal may be applied to the second test terminal 42, and the transistors T respectively connected to the control signal terminals SW5, SW6, SW7, SW8 may be turned on in sequence, to test whether the first test terminal 41 receives the voltage signal.

If when each transistor T is turned on, the first test terminal 41 receives the voltage signal, it may be determined that each first test wiring 31 connected to the second diode D2 may not have a crack, and then it may be further determined that the signal wiring 20 corresponding to each first test wiring 31 connected to the second diode D2 may not be at a risk of being scratched. In other words, the signal wiring 20 corresponding to each first test wiring 31 connected to the second diode D2 may not have a crack. If when one or more transistors T are turned on, the first test terminal 41 does not receive the voltage signal, it may be determined that the first test wiring 31 connected to the transistor may have a crack, and then it may be further determined that the signal wiring 20 corresponding to the first test wiring 31 may be at a risk of being scratched. In other words, the signal wiring 20 corresponding to the first test wiring 31 may be at a risk of having a crack.

In the disclosed embodiments of the present disclosure, by providing the diodes and the transistors, even in a case where three or more first test wirings 31 are connected in parallel, it may still be tested whether each first test wiring 31 has a crack, such that a location of the signal wiring being at a risk of having a crack may be specifically determined.

In certain embodiments, the test wirings may include a plurality of test wiring groups, and each test wiring group may correspond to one first test terminal and one second test terminal. Gates of at least two transistors may be connected to a same control signal terminal. The at least two transistors may be located in different test wiring groups, and the at least two transistors may be simultaneously connected to the first test terminal or the second test terminal.

Figure 13:
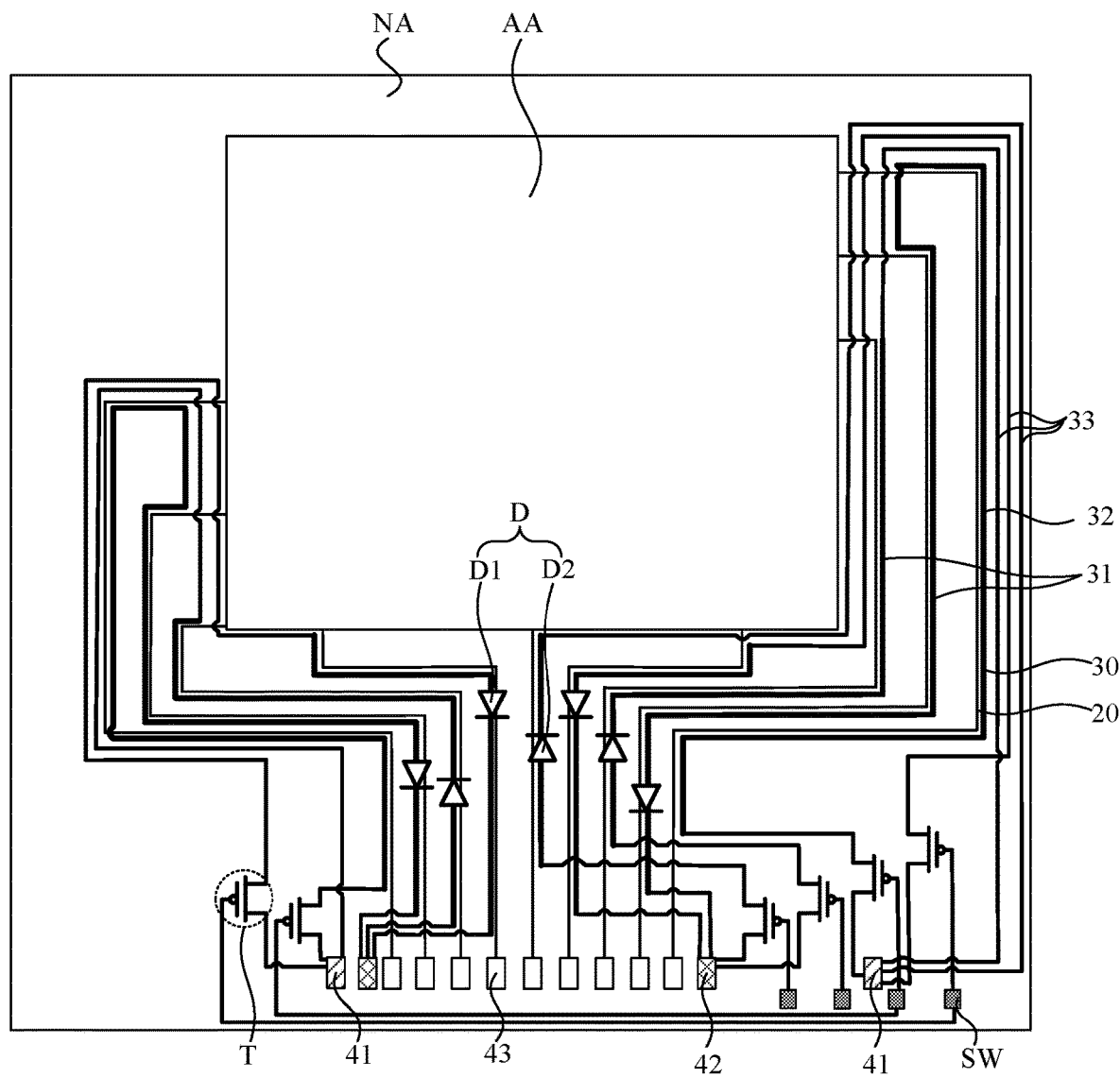
FIG. 13 illustrates a schematic top view of another exemplary display panel consistent with disclosed embodiments of the present disclosure.
Figure 14:
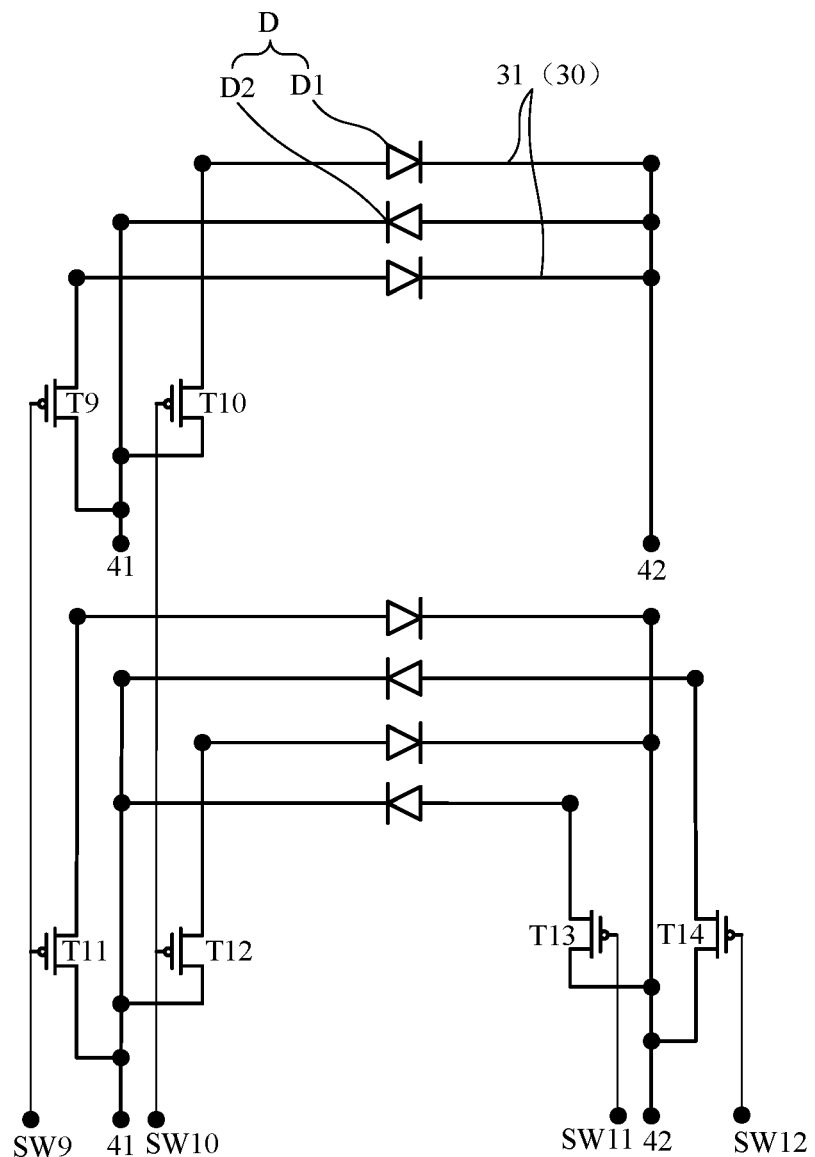
FIG. 14 illustrates a schematic diagram of an equivalent circuit of test wirings in FIG. 13.

Referring to FIG. 13 and FIG. 14, the test wirings 30 may include two test wiring groups. One of the two test wiring groups may include one second test wiring 32, three first test wirings 31, two first diodes D1, one second diode D2, and two transistors T. Another one of the two test wiring groups may include one second test wiring 32, four first test wirings 31, two first diodes D1, two second diodes D2, and four transistors T. The two transistors in one test wiring group and the two transistors in the another one test wiring group may share control signal terminals SW, respectively. For illustrative purposes, FIG. 13 merely illustrates that one transistor T may be connected between the first test terminal 41 and the first diode D1, and one transistor T may be connected between the second diode D2 and the second test terminal 42. Six transistors may one-to-one correspond to six diodes, and a transistor T may be electrically connected to the anode of the first diode D1 or the anode of the second diode D2. The transistor T may be connected to the anode of the diode through the connection lead 33.

It should be noted that to clearly illustrate the wirings, FIG. 13 illustrates that the orthographic projection of the signal wiring 20 on the substrate 10 may not overlap the orthographic projection of the test wiring 30 on the substrate 10. In fact, the orthographic projection of the signal wiring 20 on the substrate 10 may overlap the orthographic projection of the test wiring 30 on the substrate 10.

Referring to FIG. 14, four control signal terminals SW may include control signal terminals SW9, SW10, SW11, SW12, respectively, and the six transistors T may include transistors T9, T10, T11, T12, T13, and T14, respectively. FIG. 14 exemplarily illustrates that the transistors T9 and T11 may share the control terminal SW9, and the transistors T10 and T12 may share the control terminal SW10.

In the disclosed embodiments of the present disclosure, by sharing the control signal terminal, while testing whether each first test wiring has a crack, the quantity of control signal terminals may be reduced, and the structure of the display panel may be simplified.

In certain embodiments, when M≥3, in other words, when the quantity of first test wirings 31 connected in parallel between the same first test terminal 41 and the same second test terminal 42 is greater than or equal to three, an absolute value of the difference between the quantity of the first diodes D1 and the quantity of the second diodes D2 may be less than or equal to one. In view of this, the difference between the quantity of transistors T connected to the first diodes D1 and the quantity of transistors T connected to the second diodes D2 may be reduced, which may facilitate the distribution of the transistors T.

The display panel 100 may further include a driving device layer 60. The driving device layer 60 may be disposed on the side of the substrate 10 facing away from the signal wiring 20, and at least one of the diode D and the transistor T may be disposed in the driving device layer 60. For illustrative purposes, referring to FIG. 15, both the diode D and the transistor T may be disposed in the driving device layer 60, and may be connected to the first test wiring 31 through a via. To achieve the display function of the display panel, a pixel circuit may often be disposed in the driving device layer 60 of the display panel. The pixel circuit may include a transistor, a capacitor, or any other device. By disposing at least one of the diode D and the transistor T in the driving device layer 60, the diode D or the transistor T may be formed while forming the device in the pixel circuit, which may simplify the process flow of the display panel.

Figure 15:
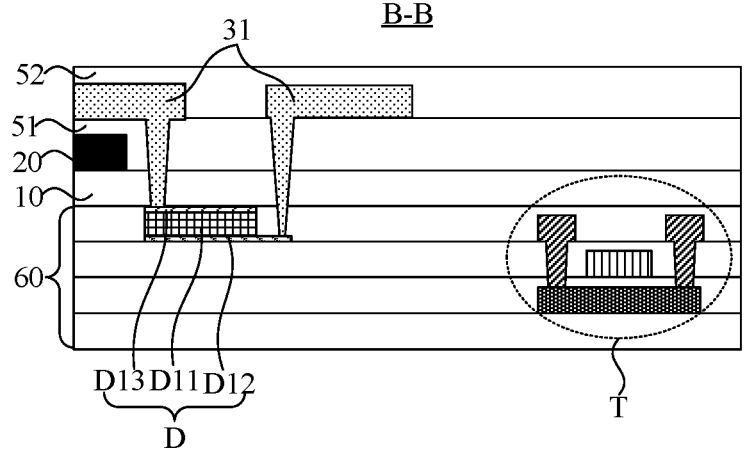
FIG. 15 illustrates a B-B sectional view of an exemplary structure in FIG. 11.

In one embodiment, the diode D may include a first electrode D12, a semiconductor layer D11, and a second electrode D13 that are stacked. The first electrode D12 may be an anode, and the second electrode D13 may be a cathode. FIG. 15 merely illustrates an example, and the specific structures of the diode D and the transistor T and the locations of the diode D and the transistor T in respective film layers may not be limited by the present disclosure.

In certain embodiments, referring to FIG. 1, the display panel 100 may further include a signal terminal 43. The signal terminal 43 may be electrically connected to one end of the signal wiring 20. In one embodiment, the signal terminal 43 may be a bonding pad. The signal terminal 43 may be bonded to a flexible printed circuit (FPC) board, and a driving chip (IC) may be bonded to the flexible printed circuit board, which may not be limited by the present disclosure.

The display panel 100 may include a display region AA and a non-display region NA at least partially surrounding the display region AA. The first test terminal 41, the second test terminal 42 and the signal terminal 43 may be disposed in the non-display region NA, to avoid affecting the display quality of the display panel.

In one embodiment, the first test terminal 41, the second test terminal 42 and the signal terminal 43 may be arranged adjacent to each other. In another embodiment, the first test terminal 41, the second test terminal 42 and the signal terminal 43 may be arranged in a row.

Figure 16:
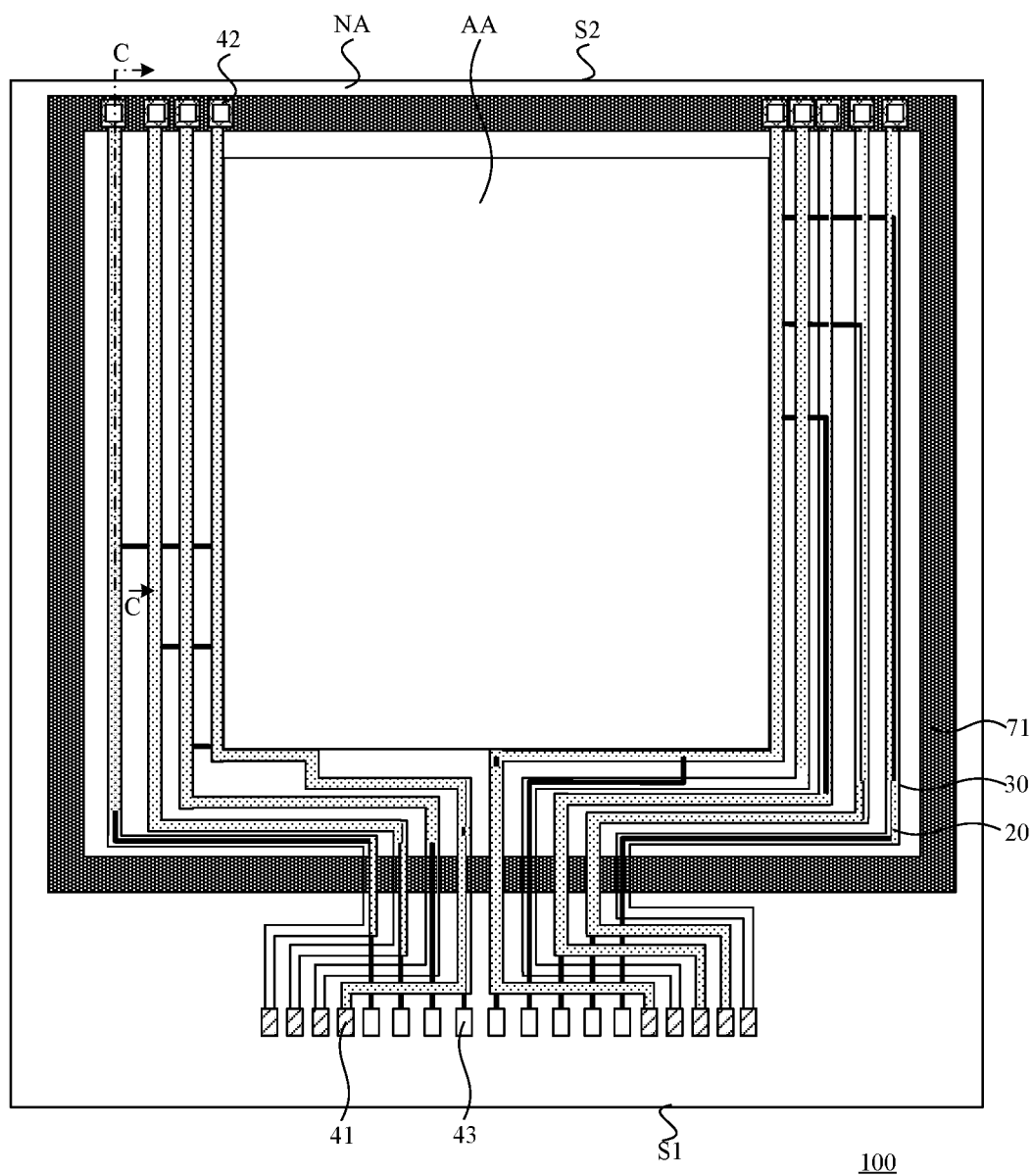
FIG. 16 illustrates a schematic top view of another exemplary display panel consistent with disclosed embodiments of the present disclosure.

In certain embodiments, referring to FIG. 16, the quantity of the test wirings 30, the quantity of the first test terminals 41, and the quantity of the second test terminals 42 may be N. Each of the N test wirings 30 may be connected with each of the N first test terminals 41 and the N second test terminals 42 in a one-to-one correspondence. The first test terminal 41 may serve as a signal output terminal and a signal receiving terminal, and the second test terminal 42 may serve as a capacitance sensing terminal. In one embodiment, by using the principle of self-capacitive, an electrical signal may be provided to the first test terminal 41, and the capacitance between the second test terminal 42 and a ground voltage terminal (or ground signal) may be tested. If the capacitance generated on the second test terminal 42 is received through the first test terminal 41, the test wiring 30 may not have a crack, and then it may be further determined that the signal wiring 20 may not have a crack. If the capacitance generated on the second test terminal 42 is not received through the first test terminal 41, the test wiring 30 may have a crack, and then it may be further determined that the signal wiring 20 may be at a risk of having a crack.

In the disclosed embodiments of the present disclosure, through each pair of the first test terminal 41 and the second test terminal 42, it may be determined whether each test wiring 30 has a crack, and then the location of the signal wiring being at a risk of having a crack may be specifically determined.

Figure 17:
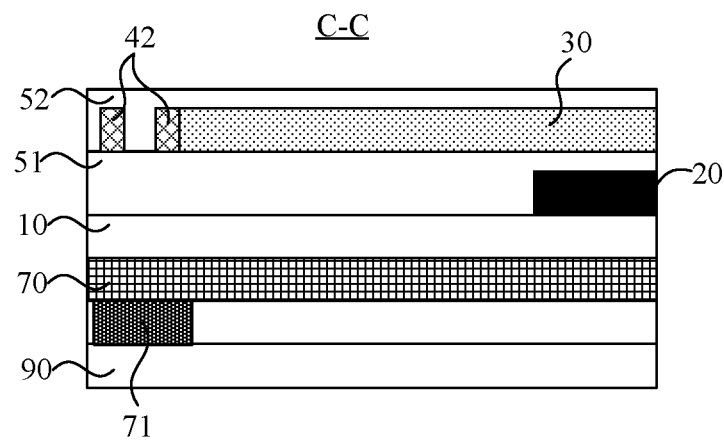
FIG. 17 illustrates a C-C sectional view of an exemplary structure in FIG. 16.
Figure 18:
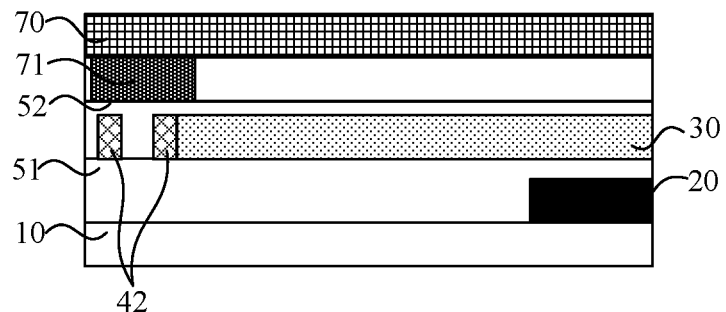
FIG. 18 illustrates another C-C sectional view of an exemplary structure in FIG. 16.

In certain embodiments, referring to FIGS. 16-18, the display panel 100 may include a display region AA and a non-display region NA at least partially surrounding the display region AA. The display panel 100 may further include an encapsulation cover 70 and an encapsulation adhesive 71. The encapsulation adhesive 71 may be disposed around the display region AA. The encapsulation cover 70 may be a glass cover, and the encapsulation adhesive 71 may be a frit. The encapsulation adhesive 71 may be disposed on a side of the encapsulation cover 70 and may be disposed in the non-display region NA. The orthographic projection of the second test terminal 42 on the substrate 10 may overlap the orthographic projection of the encapsulation adhesive 71 on the substrate 10, and the second test terminal 42 may have a hollowed structure. When the encapsulation adhesive 71 is a frit, the encapsulation adhesive 71 may need to be cured by ultraviolet light (i.e., UV curing), and the second test terminal 42 may have a hollowed structure to ensure that sufficient ultraviolet light may be irradiated onto the encapsulation adhesive 71, to avoid affecting the packaging effect of display panel.

In one embodiment, the outer contour of the orthographic projection of the second test terminal 42 on the substrate 10 may be a rectangle, a square, a circle, a diamond, etc., which may not be limited by the present disclosure.

In one embodiment, referring to FIG. 17, the encapsulation cover 70 may be disposed on the side of the substrate 10 facing away from the signal wirings 20, and the encapsulation adhesive 71 may be disposed on the side of the encapsulation cover 70 facing away from the substrate. The display panel may further include an array substrate 90 including a thin film transistor array layer and a light-emitting device layer. The encapsulation adhesive 71 may be configured to bond the encapsulation cover 70 and the array substrate 90. In another embodiment, referring to FIG. 18, the encapsulation cover 70 may be disposed on the side of the test wiring facing away from the substrate 10, and the encapsulation adhesive 71 may be disposed on the side of the encapsulation cover 70 facing towards the substrate 10, which may not be limited by the present disclosure.

In certain embodiments, referring to FIG. 16, the display panel may have a first edge S1 and a second edge S2 opposite to the first edge S1. The first test terminal 41 may be disposed adjacent to the first edge S1, and the second test terminal 42 may be disposed adjacent to the second edge S2. In view of this, the distance between the first test terminal 41 and the second test terminal 42 may be prevented from being too small, and mutual interference between the first test terminal 41 and the second test terminal 42 may be avoided.

Figure 19:
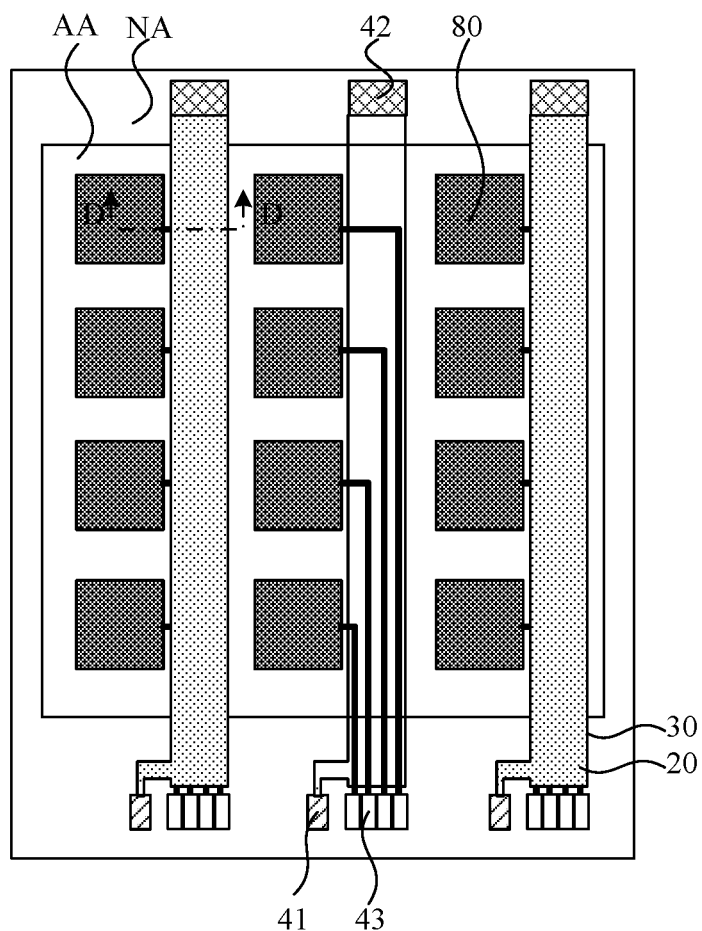
FIG. 19 illustrates a schematic top view of another exemplary display panel consistent with disclosed embodiments of the present disclosure.
Figure 20:
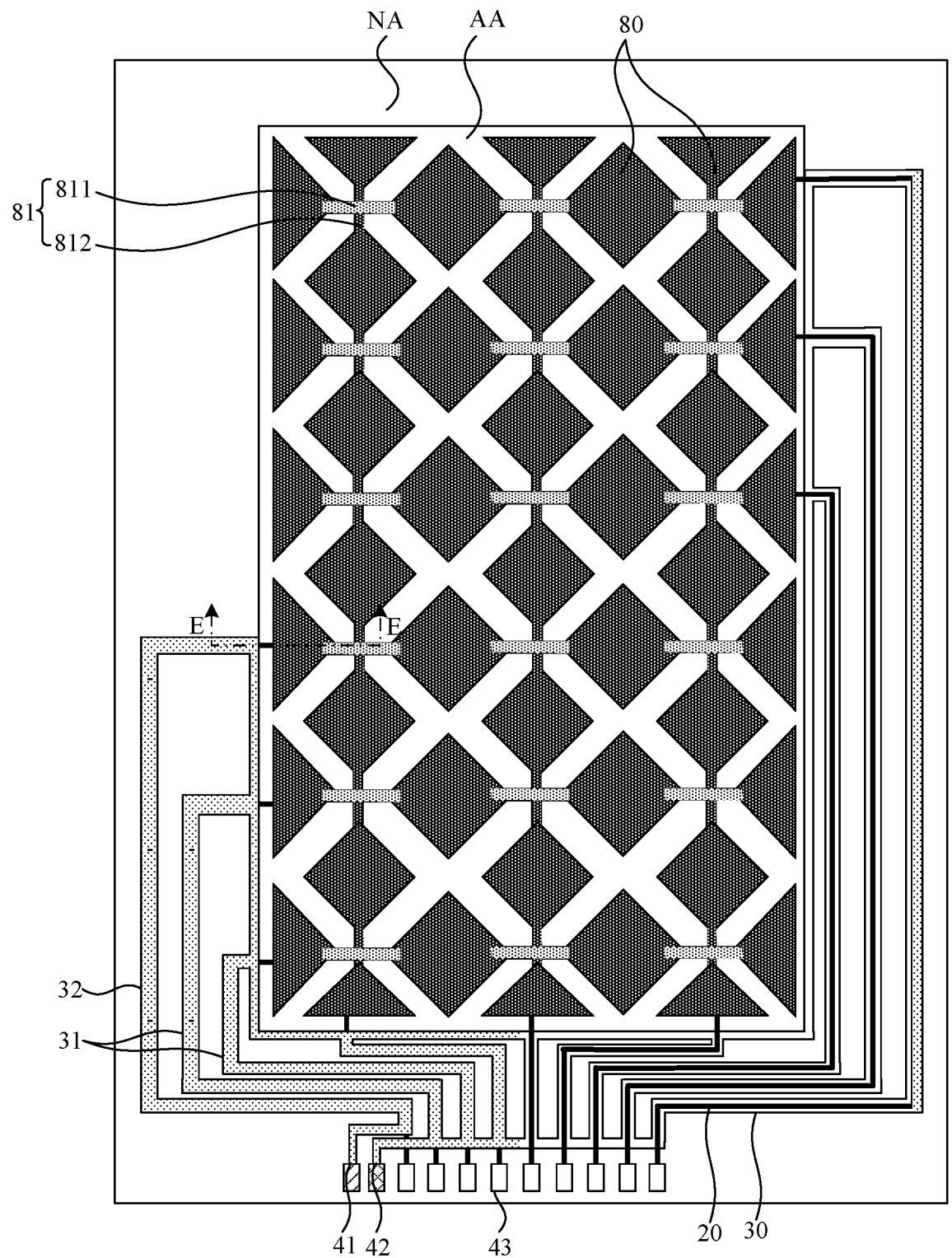
FIG. 20 illustrates a schematic top view of another exemplary display panel consistent with disclosed embodiments of the present disclosure.

In certain embodiments, referring to FIG. 19 and FIG. 20, the display panel 100 may include a display region AA and a non-display region NA at least partially surrounding the display region AA. The display panel 100 may further include a touch-control electrode 80 disposed in the display region, and the signal wiring 20 may be electrically connected to the touch-control electrode 80. In other words, the signal wiring 20 may be a touch-control wiring to transmit a touch-control signal.

In one embodiment, the touch-control electrode 80 may be distributed in the display region AA in an array. For example, referring to FIG. 19, the touch-control structure of the display panel 100 may be a self-capacitive touch-control structure. The signal wiring 20 and the touch-control electrode 80 may be electrically connected in a one-to-one correspondence. For another example, the touch-control structure of the display panel 100 may be a mutual-capacitive touch-control structure. The signal wiring 20 may be electrically connected to one row or one column of touch-control electrodes 80, and the touch-control electrodes 80 in a same row or a same column may be connected to each other.

In addition, when the touch-control structure of the display panel 100 is a self-capacitive touch-control structure, the signal wiring 20 and the test wiring 30 may be disposed in both the display region AA and the non-display region NA, and the first test terminal 41 and the second test terminal 42 may be disposed in the non-display region NA. When the touch-control structure of the display panel 100 is a mutual-capacitive touch-control structure, the signal wiring 20, the test wiring 30, the first test terminal 41, and the second test terminal 42 may be disposed in the non-display region NA.

Figure 21:
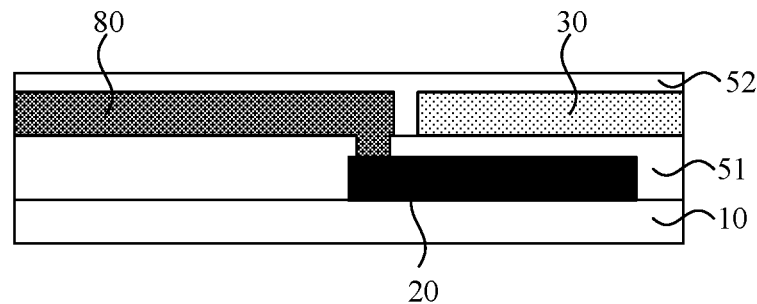
FIG. 21 illustrates a D-D sectional view of an exemplary structure in FIG. 19.

Referring to FIG. 19 and FIG. 21, the touch-control structure of the display panel 100 may be a self-capacitive touch-control structure. The touch-control electrode 80 may be disposed on the side of the signal wiring 20 facing away from the substrate 10. The test wiring 30 may be made of a same material and formed in a same layer as the control-control electrode 80, such that the touch-control electrode 80 and the test wiring 30 may be simultaneously formed in a same process step, which may simplify the process step.

Figure 22:
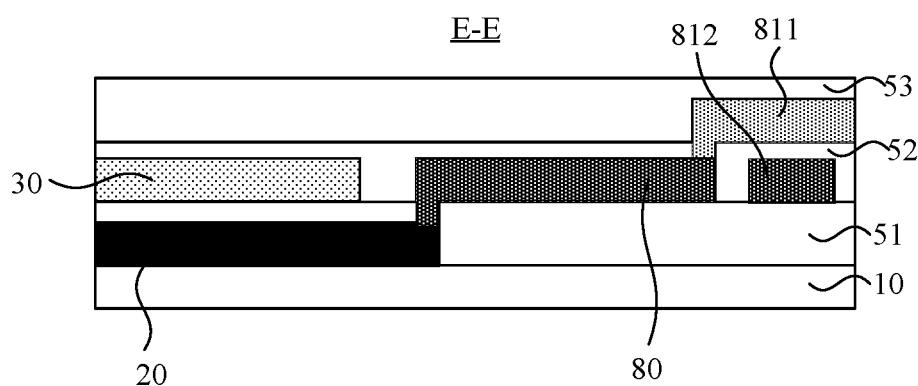
FIG. 22 illustrates an E-E sectional view of an exemplary structure in FIG. 20.
Figure 23:
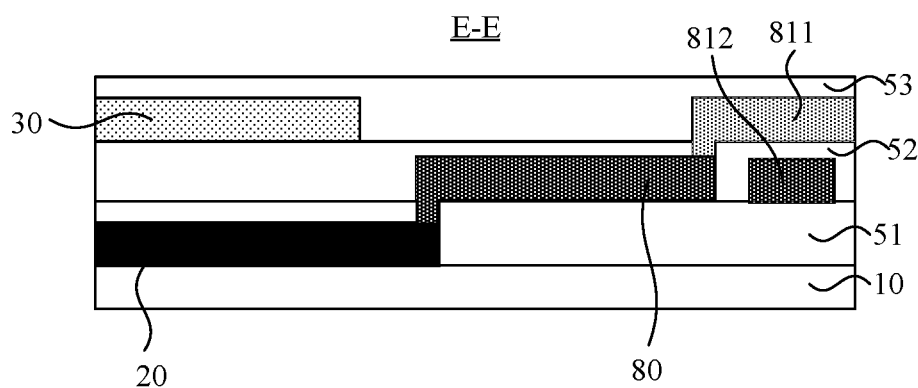
FIG. 23 illustrates another E-E sectional view of an exemplary structure in FIG. 20.

Referring to FIG. 20 and FIG. 22, the touch-control structure of the display panel 100 may be a mutual-capacitive touch-control structure. The display panel 100 may include a connection part 81. The connection part 81 may include a first connection part 811 and a second connection part 812. The first connection part 811 may be formed in a layer different from the touch-control electrode 80, and may be connected to the touch-control electrode 80 through a via. In one embodiment, the first connection part 811 may connect adjacent touch-control electrodes 80 in a same row, and the second connection part 812 may connect adjacent touch-control electrodes 80 in a same column. The first connection part 811 may be formed in a layer different from the touch-control electrode 80, and the second connection part 812 may be formed in a same layer as the touch-control electrode 80. The test wiring 30 may be made of a same material and formed in a same layer as any one of the touch-control electrode 80 and the first connection part 811. For illustrative purposes, FIG. 22 illustrates that the test wiring 30 may be formed in a same layer as the touch-control electrode 80, and FIG. 23 illustrates that the test wiring 30 may be formed in a same layer as the first connection part 811. In the present disclosure, the test wiring 30 and one of the touch-control electrode 80 and the connection part (the first connection part or the second connection part) may be simultaneously formed using a same material in a same process step, thereby simplifying the process steps.

In certain embodiments, referring to FIG. 22 or FIG. 23, the display panel 100 may further include a thin film encapsulation layer (not illustrated), and the touch-control structure of the display panel 100 may be integrated on the thin film encapsulation layer. The display panel 100 may further include a third insulating layer 53 disposed on a side of the first connection part 811 facing away from the substrate. The substrate 10 may be a flexible substrate. In one embodiment, the substrate 10 may be made of an inorganic material including silicon nitride, etc.

Figure 24:
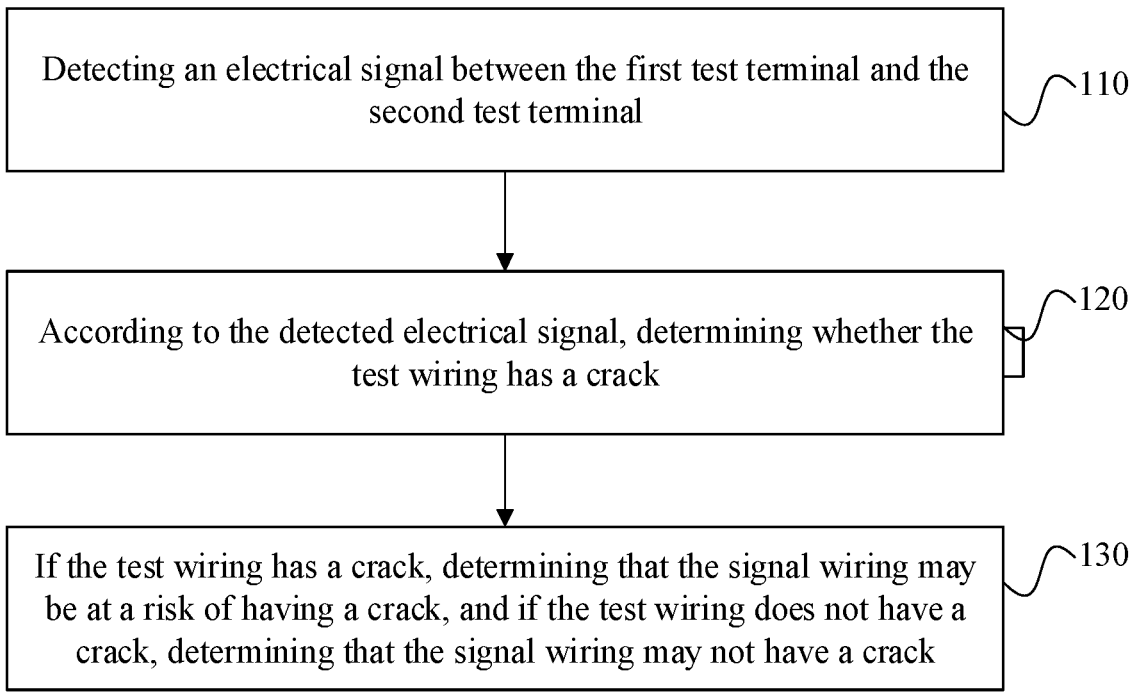
FIG. 24 illustrates a schematic flowchart of an exemplary crack detection method of a display panel consistent with disclosed embodiments of the present disclosure.

The present disclosure also provides a crack detection method of a display panel. FIG. 24 illustrates a schematic flowchart of a crack detection method of a display panel consistent with disclosed embodiments of the present disclosure. Referring to FIG. 24, the crack detection method of the display panel may include steps 110-130.

Step 110: detecting an electrical signal between the first test terminal and the second test terminal. Detecting the electrical signal between the first test terminal and the second test terminal may include any one of detecting a resistance value between the first test terminal and the second test terminal, detecting a capacitance value generated by the second test terminal through the first test terminal, and detecting a voltage value between the first test terminal and the second test terminal.

Step 120: according to the detected electrical signal, determining whether the test wiring has a crack.

Step 130: if the test wiring has a crack, determining that the signal wiring may be at a risk of having a crack, and if the test wiring does not have a crack, determining that the signal wiring may not have a crack.

In the disclosed crack detection method of the display panel, the test wiring and the test terminal (the first test terminal and the second test terminal) may be disposed on the display panel. On the one hand, an electrical signal (such as a resistance value, a capacitance value, or a voltage value) between the first test terminal and the second test terminal may be tested to determine whether the test wiring has a crack. If the test wiring has a crack, the test wiring may have been scratched, and a scratch depth may reach a position where the signal wiring is located. Then, it may be determined that the signal wiring may be at a substantially high risk of having a crack, such that the display panel with the signal wiring being at a risk of having a crack may be prevented from flowing into the next process or flowing to the client. On the other hand, because the test wiring is disposed on the side of the signal wiring facing away from the substrate, the test wiring and the insulating layer between the test wiring and the signal wiring may serve as a protection structure for the signal wiring, to reduce the risk of the signal wiring being scratched.

Figure 25:
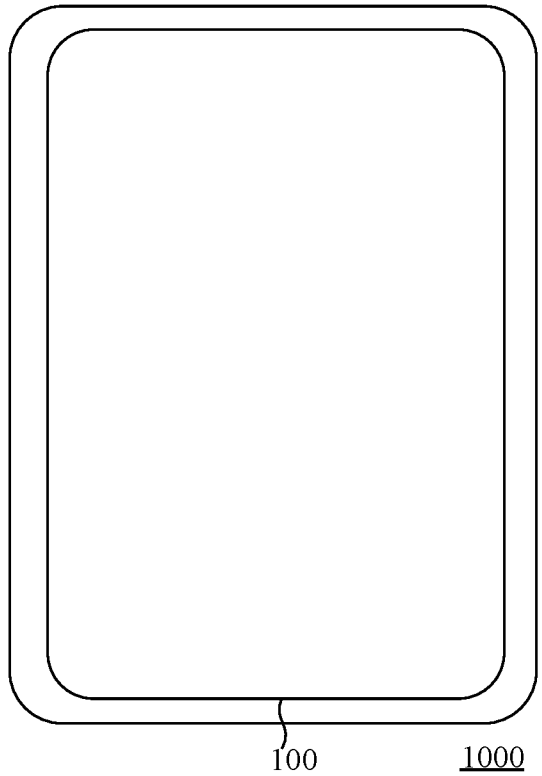
FIG. 25 illustrates a schematic diagram of an exemplary display device consistent with disclosed embodiments of the present disclosure.

The present disclosure also provides a display device. FIG. 25 illustrates a schematic diagram of a display device consistent with disclosed embodiments of the present disclosure. Referring to FIG. 25, the display device 1000 may include a display panel 100 in any of the foregoing disclosed embodiments of the present disclosure. For illustrative purposes, the display device 1000 as a mobile phone in embodiment associated with FIG. 25 may be described in detail as an example. It should be understood that the display device in the present disclosure may be a wearable product, a computer, a TV, a vehicle-mounted display device, or any other display device with a display function, which may not be limited by the present disclosure. The display device in the present disclosure may have the beneficial effects of the display panel in the present disclosure, which may refer to specific descriptions of the display panel in the foregoing embodiments, and may not be repeated herein.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
a substrate;
a signal wiring, disposed over the substrate;
a test wiring, insulated from the signal wiring and disposed on a side of the signal wiring facing away from the substrate, wherein an orthographic projection of the test wiring on the substrate overlaps an orthographic projection of the signal wiring on the substrate;
a first test terminal, disposed over the substrate and electrically connected with an end of the test wiring; and
a second test terminal, disposed over the substrate and electrically connected with another end of the test wiring.

2. The display panel according to claim 1, wherein:
a quantity of test wirings is N, and each test wiring is disposed corresponding to at least one signal wiring, wherein N is an integer greater than or equal to one.

3. The display panel according to claim 2, wherein:
the N test wirings include M first test wirings, and the M first test wirings are connected in parallel between the first test terminal and the second test terminal, wherein M is an integer greater than or equal to two and less than or equal to N.

4. The display panel according to claim 3, wherein:
the N test wirings include at least one second test wiring, and multiple first test wirings of the M first test wirings are electrically connected to one of the first test terminal and the second test terminal through one second test wiring of the at least one second test wiring.

5. The display panel according to claim 4, further including:
M diodes, wherein:
each first test wiring of the M first test wirings includes a first section and a second section, wherein:
one of the first section and the second section is connected to an anode of a diode of the M diodes, and
another one of the first section and the second section is connected to a cathode of the diode, and
the M diodes include at least one first diode and at least one second diode, wherein:
an anode of a first diode of the at least one first diode is connected to the first test terminal, and a cathode of the first diode is connected to the second test terminal, and
an anode of a second diode of the at least one second diode is connected to the second test terminal, and a cathode of the second diode is connected to the first test terminal.

6. The display panel according to claim 5, when M is greater than or equal to three, further including:
one or more transistors and a control signal terminal, wherein:
a gate of each of the one or more transistors is electrically connected to the control signal terminal, and
among the at least one first diode and the at least one second diode, whoever of the first diode or the second diode has a quantity greater than or equal to two is a target diode, and each target diode and at least one transistor of the one or more transistors are connected in series between the first test terminal and the second test terminal.

7. The display panel according to claim 6, wherein:
an absolute value of a difference between a quantity of the at least one first diode and a quantity of the at least one second diode is less than or equal to one.

8. The display panel according to claim 6, further including:
a driving device layer, wherein the driving device layer is disposed on a side of the substrate facing away from the signal wiring, and at least one of the diode and the transistor is disposed in the driving device layer.

9. The display panel according to claim 4, further including:
a signal terminal, wherein the signal terminal is electrically connected to one end of the signal wiring, and
a display region and a non-display region at least partially surrounding the display region, wherein the first test terminal, the second test terminal and the signal terminal are disposed in the non-display region.

10. The display panel according to claim 2, wherein:
both a quantity of first test terminals and a quantity of second test terminals are N, and each of the N test wirings is connected with each of the N first test terminals and the N second test terminals in a one-to-one correspondence, and
the first test terminal serves as a signal output terminal and a signal receiving terminal, and the second test terminal serves as a capacitance sensing terminal.

11. The display panel according to claim 10, further including:
a display region and a non-display region at least partially surrounding the display region,
an encapsulation cover, and
an encapsulation adhesive, disposed on a side of the encapsulation cover and in the non-display region, wherein:
an orthographic projection of the second test terminal on the substrate overlaps an orthographic projection of the encapsulation adhesive on the substrate, and
the second test terminal has a hollowed structure.

12. The display panel according to claim 10, further including:
a first edge and a second edge opposite to the first edge, wherein the first test terminal is disposed adjacent to the first edge, and the second test terminal is disposed adjacent to the second edge.

13. The display panel according to claim 1, further including:
a display region and a non-display region at least partially surrounding the display region, and
a touch-control electrode, disposed in the display region, wherein the signal wiring is electrically connected to the touch-control electrode.

14. The display panel according to claim 13, wherein:
the signal wiring is made of a same material and formed in a same layer as the touch-control electrode; or
the display panel further includes a connection part, the connection part including a first connection part electrically connected with the touch-control electrode, wherein:
the first connection part is formed in a layer different from the touch-control electrode, and
the test wiring is made of a same material and formed in a same layer as one of the touch-control electrode and the first connection part.

15. A crack detection method of a display panel, configured to test the display panel, comprising:
providing the display panel, the display panel including:
a substrate,
a signal wiring, disposed over the substrate,
a test wiring, insulated from the signal wiring and disposed on a side of the signal wiring facing away from the substrate, wherein an orthographic projection of the test wiring on the substrate overlaps an orthographic projection of the signal wiring on the substrate,
a first test terminal, disposed over the substrate and electrically connected with an end of the test wiring, and
a second test terminal, disposed over the substrate and electrically connected with another end of the test wiring;
detecting an electrical signal between the first test terminal and the second test terminal, wherein detecting the electrical signal between the first test terminal and the second test terminal includes one of: detecting a resistance value between the first test terminal and the second test terminal, detecting a capacitance value generated by the second test terminal through the first test terminal, and detecting a voltage value between the first test terminal and the second test terminal;

according to the detected electrical signal, determining whether the test wiring has a crack; and if the test wiring has a crack, determining that the signal wiring is at a risk of having a crack, and if the test wiring does not have a crack, determining that the signal wiring does not have a crack.

16. A display device, comprising:
    a display panel, wherein the display panel includes:
    a substrate,
    a signal wiring, disposed over the substrate,
    a test wiring, insulated from the signal wiring and disposed on a side of the signal wiring facing away from the substrate, wherein an orthographic projection of the test wiring on the substrate overlaps an orthographic projection of the signal wiring on the substrate,
    a first test terminal, disposed over the substrate and electrically connected with an end of the test wiring, and
    a second test terminal, disposed over the substrate and electrically connected with another end of the test wiring.

* * * * *